US010666202B2

(12) United States Patent
Khlat et al.

(10) Patent No.: US 10,666,202 B2
(45) Date of Patent: *May 26, 2020

(54) ENVELOPE TRACKING POWER MANAGEMENT CIRCUIT

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/411,568

(22) Filed: May 14, 2019

(65) Prior Publication Data
US 2019/0267947 A1    Aug. 29, 2019

Related U.S. Application Data

(63) Continuation of application No. 15/939,406, filed on Mar. 29, 2018, now Pat. No. 10,326,408.

(60) Provisional application No. 62/560,017, filed on Sep. 18, 2017.

(51) Int. Cl.
| H03F 1/02 | (2006.01) |
| H03F 3/189 | (2006.01) |
| H03G 3/30 | (2006.01) |
| H03F 3/24 | (2006.01) |

(Continued)

(52) U.S. Cl.
CPC .......... *H03F 1/0233* (2013.01); *H03F 1/025* (2013.01); *H03F 1/0222* (2013.01); *H03F 1/0255* (2013.01); *H03F 3/189* (2013.01); *H03F 3/211* (2013.01); *H03F 3/24* (2013.01); *H03F 3/245* (2013.01); *H03F 3/68* (2013.01); *H03G 3/3042* (2013.01); *H03F 2200/102* (2013.01)

(58) Field of Classification Search
CPC .................................................... H03F 1/0211
USPC ................................. 330/127, 297, 285, 296
See application file for complete search history.

(56) References Cited

U.S. PATENT DOCUMENTS

| 6,434,122 B2 | 8/2002 | Barabash et al. |
| 8,008,970 B1 | 8/2011 | Homol et al. |
| 8,571,498 B2 | 10/2013 | Khlat |

(Continued)

OTHER PUBLICATIONS

Notice of Allowance for U.S. Appl. No. 15/939,406, dated Feb. 4, 2019, 6 pages.

*Primary Examiner* — Henry Choe
(74) *Attorney, Agent, or Firm* — Withrow &Terranova, P.L.L.C.

(57) ABSTRACT

An envelope tracking (ET) power management circuit is provided. The ET power management circuit includes an amplifier circuit(s) configured to output a radio frequency (RF) signal at a defined power level corresponding to a direct current, an alternating current, and an ET modulated voltage received by the amplifier circuit(s). The ET power management circuit can operate in a high-power ET mode when the defined power level exceeds a defined power level threshold and the RF signal is modulated to include no more than a defined number of resource blocks. The ET power management includes two ET tracker circuitries each generating a respective ET modulated voltage and two charge pump circuitries each generating a respective current. In the high-power ET mode, both charge pump circuitries are activated to each provide a reduced current to the amplifier circuit, thus helping to reduce a footprint and cost of the ET power management circuit.

8 Claims, 4 Drawing Sheets

(51) Int. Cl.
*H03F 3/21* (2006.01)
*H03F 3/68* (2006.01)

(56) References Cited

U.S. PATENT DOCUMENTS

| | | |
|---|---|---|
| 8,909,175 B1 | 12/2014 | McCallister |
| 9,112,452 B1 | 8/2015 | Khlat |
| 9,247,496 B2 * | 1/2016 | Khlat ................ H04W 52/0209 |
| 9,401,678 B2 * | 7/2016 | Kay ..................... H03F 1/0244 |
| 9,484,865 B2 | 11/2016 | Kobayashi et al. |
| 2006/0244513 A1 | 11/2006 | Yen et al. |
| 2009/0045877 A1 | 2/2009 | Wang et al. |
| 2010/0219887 A1 | 9/2010 | Ichitsubo et al. |
| 2010/0283534 A1 | 11/2010 | Pierdomenico |
| 2012/0062205 A1 | 3/2012 | Levesque et al. |
| 2012/0176196 A1 | 7/2012 | Khlat |
| 2012/0281597 A1 | 11/2012 | Khlat et al. |
| 2013/0141064 A1 | 6/2013 | Kay et al. |
| 2013/0141068 A1 | 6/2013 | Kay et al. |
| 2013/0165132 A1 | 6/2013 | Goedken et al. |
| 2013/0285750 A1 | 10/2013 | Chowdhury et al. |
| 2013/0307617 A1 | 11/2013 | Khlat et al. |
| 2014/0062590 A1 | 3/2014 | Khlat et al. |
| 2014/0105327 A1 | 4/2014 | Geng et al. |
| 2014/0225674 A1 * | 8/2014 | Folkmann ............. H03F 1/0222 330/297 |
| 2015/0091653 A1 | 4/2015 | Kobayashi et al. |
| 2015/0180422 A1 | 6/2015 | Khlat et al. |
| 2015/0234402 A1 | 8/2015 | Kay et al. |
| 2016/0164476 A1 | 6/2016 | Wang et al. |
| 2017/0124013 A1 | 5/2017 | Vaillancourt et al. |
| 2018/0205347 A1 | 7/2018 | Das et al. |
| 2018/0351454 A1 * | 12/2018 | Khesbak ............... H02M 3/156 |

* cited by examiner

ENVELOPE TRACKING POWER MANAGEMENT CIRCUIT

RELATED APPLICATIONS

This application is a continuation of U.S. patent application Ser. No. 15/939,406, filed on Mar. 29, 2018, now U.S. Pat. No. 10,326,408, which claims the benefit of provisional patent application Ser. No. 62/560,017, filed Sep. 18, 2017, the disclosures of which are hereby incorporated herein by reference in their entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) new radio (NR) (5G-NR) wireless communication systems have been widely regarded as the next wireless communication standard beyond the current third-generation (3G) communication standard, such as wideband code division multiple access (WCDMA), and fourth-generation (4G) communication standard, such as long-term evolution (LTE). The 5G-NR wireless communication system is expected to provide a significantly higher data rate, improved coverage range, enhanced signaling efficiency, and reduced latency compared to wireless communication systems based on the 3G and 4G communication standards. Moreover, the 5G-NR communication system is an orthogonal frequency division multiplexing (OFDM) based wireless system designed to operate across a wide range of radio frequency (RF) bands, which include a low-band (below 1 GHz), a mid-band (1 GHz to 6 GHz), and a high-band (above 24 GHz).

A portion of the 5G-NR RF bands, particularly the low-band and the mid-band, overlaps with the RF bands currently used by the 3G and/or the 4G wireless communication systems. As such, the 5G-NR wireless communication systems are designed to provide greater scalability across all the 5G-NR RF bands. For example, the 5G-NR wireless communication system can scale down to operate in the 3G/4G RF bands based on the 3G/4G wireless communication standard for lower throughput applications and/or in suburban locations, and scale up to operate in the 5G-NR RF bands based on the 5G-NR communication standard for higher throughput applications and/or in urban/indoor locations. Notably, the mobile communication devices may be subject to different power requirements when transmitting RF communication signals in the 5G-NR RF bands and/or the 3G/4G RF bands. In this regard, the mobile communication devices typically employ power amplifier circuits to generate the RF communication signals at the required power levels. As such, it may be desirable to configure the power amplifier circuits to operate according to a wide range of power requirements without sacrificing efficiency and increasing a footprint of the power amplifier circuits.

SUMMARY

Embodiments of the disclosure relate to an envelope tracking (ET) power management circuit. The ET power management circuit includes an amplifier circuit(s) configured to output a radio frequency (RF) signal at a defined power level corresponding to a direct current, an alternating current, and an ET modulated voltage received by the amplifier circuit(s). In examples discussed herein, the ET power management circuit operates in a high-power ET mode when the defined power level exceeds a defined power level threshold and the RF signal is modulated to include no more than a defined number of resource blocks. The ET power management includes a pair of ET tracker circuitries each generating a respective ET modulated voltage and a pair of charge pump circuitries each generating a respective current. In the high-power ET mode, both charge pump circuitries are activated to each provide a reduced current (e.g., ½ of the direct current) to the amplifier circuit. As such, each charge pump circuitry can be built with smaller electrical components (e.g., inductors) to help reduce the footprint and cost of the ET power management circuit.

In one aspect, an ET power management circuit is provided. The ET power management circuit includes an amplifier circuit including an amplifier input and an amplifier output. The amplifier circuit is configured to output an RF signal at the amplifier output at a defined power level corresponding to a direct current, an alternating current, and an ET modulated voltage received at the amplifier input. The ET power management circuit also includes a first circuit coupled to the amplifier input. The first circuit includes first ET tracker circuitry configured to generate a first ET modulated voltage. The first circuit also includes first charge pump circuitry configured to generate a first direct current and a first alternating current. The ET power management circuit also includes a second circuit coupled to the amplifier input. The second circuit includes second ET tracker circuitry configured to generate a second ET modulated voltage. The second circuit also includes second charge pump circuitry configured to generate a second direct current and a second alternating current. The ET power management circuit also includes control circuitry coupled to the first circuit and the second circuit. The control circuitry is configured to configure the first circuit and the second circuit to operate in a high-power ET mode in response to the defined power level exceeding a defined power threshold and the RF signal comprising less than or equal to a defined number of RBs. The control circuitry is also configured to activate the first charge pump circuitry and the second charge pump circuitry to provide the first direct current and the second direct current to the amplifier input.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
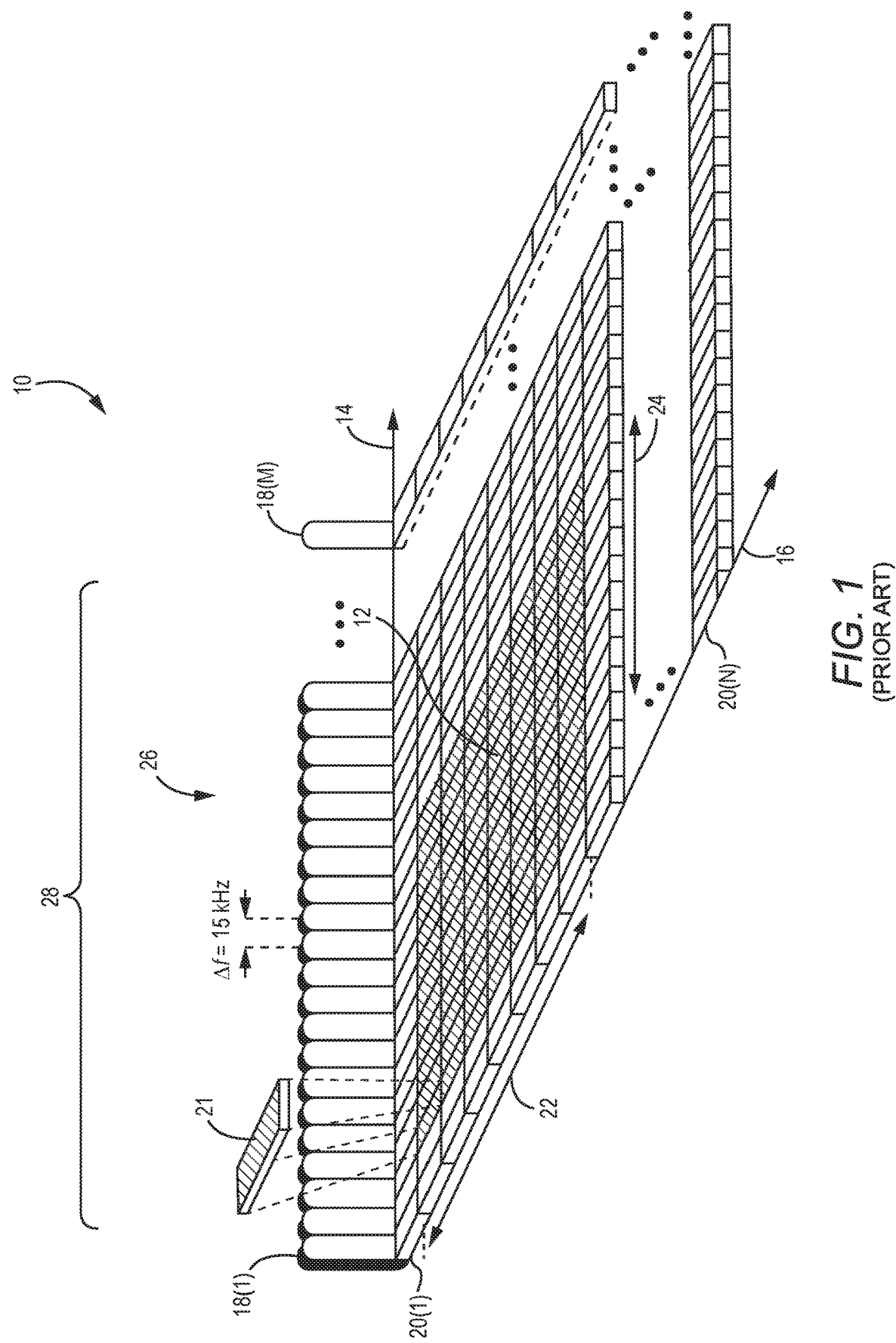
FIG. 1 is a schematic diagram of an exemplary orthogonal frequency division multiplexing (OFDM) time-frequency grid illustrating at least one resource block (RB)

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) power management circuit. The ET power management circuit includes an amplifier circuit(s) configured to output a radio frequency (RF) signal at a defined power level corresponding to a direct current, an alternating current, and an ET modulated voltage received by the amplifier circuit(s). In examples discussed herein, the ET power management circuit operates in a high-power ET mode when the defined power level exceeds a defined power level threshold and the RF signal is modulated to include no more than a defined number of resource blocks. The ET power management includes a pair of ET tracker circuitries each generating a respective ET modulated voltage and a pair of charge pump circuitries each generating a respective current. In the high-power ET mode, both charge pump circuitries are activated to each provide a reduced current (e.g., ½ of the direct current) to the amplifier circuit. As such, each charge pump circuitry can be built with smaller electrical components (e.g., inductors) to help reduce the footprint and cost of the ET power management circuit.

Before discussing the ET power management circuit of the present disclosure, a brief overview of an RB-based resource allocation scheme is first provided with reference FIG. 1 to help understand the relationship between bandwidth of an RF signal and the number of RBs allocated to the RF signal. A brief discussion of power management architecture is then provided with reference to FIGS. 2 and 3. The discussion of specific exemplary aspects of an ET power management circuit starts below with reference to FIG. 4.

In this regard, FIG. 1 is a schematic diagram of an exemplary orthogonal frequency division multiplexing (OFDM) time-frequency grid 10 illustrating at least one RB 12. The OFDM time-frequency grid 10 includes a frequency axis 14 and a time axis 16. Along the frequency axis 14, there are a number of subcarriers 18(1)-18(M). The subcarriers 18(1)-18(M) are orthogonally separated from each other by a frequency spacing $\Delta f$ of 15 KHz. Along the time axis 16, there are a number of OFDM symbols 20(1)-20(N). Each intersection of the subcarriers 18(1)-18M) and the OFDM symbols 20(1)-20(N) defines a resource element (RE) 21.

In one example, the RB 12 includes twelve (12) consecutive subcarriers among the subcarriers 18(1)-18(M), and seven (7) consecutive OFDM symbols among the OFDM symbols 20(1)-20(N). In this regard, the RB 12 includes eighty-four (84) of the REs 21 (12 subcarriers×7 OFDM symbols). The RB 12 has an RB duration 22, which equals a one-half millisecond (0.5 ms), along the time axis 16.

Accordingly, the RB 12 has a bandwidth 24, which equals 180 KHz (15 KHz/subcarrier×12 subcarriers), along the frequency axis 14. In OFDM-based communication systems such as long-term evolution (LTE) and fifth-generation new radio (5G-NR), the RB 12 is the minimum unit for allocating resources to users.

In an LTE system, an RF signal 26 can occupy multiple subcarriers among the subcarriers 18(1)-18(M). In this regard, a signal bandwidth 28 of the RF signal 26 is a function of the number of RBs 12 contained in the RF signal 26 along the frequency axis 14. In this regard, if the RF signal 26 contains ten (10) RBs 12, then the signal bandwidth 28 will be 1.8 MHz (180 KHz/RB×10 RBs). If the RF signal 26 contains twenty-five (25) RBs 12, then the signal bandwidth 28 will be 4.5 MHz (180 KHz/RB×25 RBs). If the RF signal 26 contains two hundred (200) RBs 12, then the signal bandwidth 28 will be 36 MHz (180 KHz/RB×200 RBs). In this regard, the more RBs 12 the RF signal 26 contains, the wider the signal bandwidth 28 will be, and the more subcarriers among the subcarriers 18(1)-18(M) are modulated within the RB duration 22. As such, the RF signal 26 can exhibit more and faster amplitude variations within the RB duration 22 when the RF signal 26 is modulated according to a selected modulation and coding scheme (MCS). As a result, when the RF signal 26 is amplified for transmission over a wireless medium, a power amplifier circuit would need to operate fast enough to keep up with the faster amplitude variations of the RF signal 26 across the signal bandwidth 28 within the RB duration 22. Accordingly, a circuit providing ET modulated voltage to the power amplifier circuit needs to provide the ET modulation at a faster frequency (e.g., 250 MHz or above) to keep up with the fast operation of the power amplifier circuit.

Figure 2:
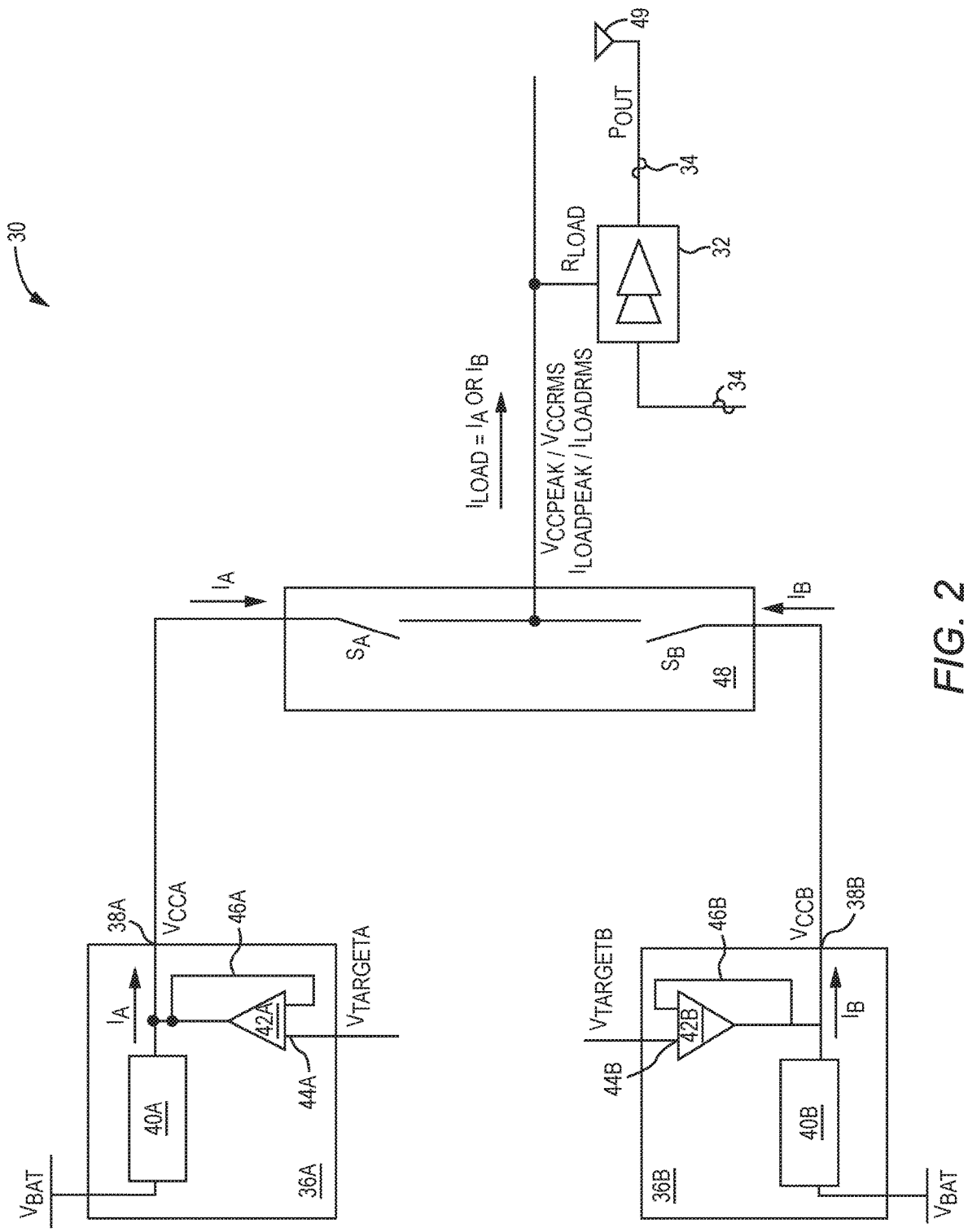
FIG. 2 is a schematic diagram of an exemplary power management circuit including an amplifier circuit configured to amplify a radio frequency (RF) signal for transmission in an RF band(s)

FIG. 2 is a schematic diagram of an exemplary power management circuit 30 including an amplifier circuit 32 configured to amplify an RF signal 34 for transmission in an RF band(s). The power management circuit 30 includes a first circuit 36A and a second circuit 36B. The first circuit 36A includes a first tracker output 38A coupled to the amplifier circuit 32. The first circuit 36A includes first charge pump circuitry 40A and first ET tracker circuitry 42A. The first charge pump circuitry 40A receives a battery voltage $V_{BAT}$ and generates a first current $I_A$, which can be a direct current, an alternate current, or a combination of both, at the first tracker output 38A. The first ET tracker circuitry 42A is configured to generate a first ET modulated voltage $V_{CCA}$ at the first tracker output 38A. In this regard, the first ET tracker circuitry 42A receives a first ET modulated target voltage $V_{TARGETA}$ at a first voltage input 44A and generates the first ET modulated voltage $V_{CCA}$ tracking the first ET modulated target voltage $V_{TARGETA}$. The first ET tracker circuitry 42A is coupled to a first feedback loop 46A, which provides a sample of the first ET modulated voltage $V_{CCA}$ back to the first ET tracker circuitry 42A.

The second circuit 36B includes a second tracker output 38B coupled to the amplifier circuit 32. The second circuit 36B includes second charge pump circuitry 40B and second ET tracker circuitry 42B. The second charge pump circuitry 40B receives the battery voltage $V_{BAT}$ and generates a second current $I_B$, which can be a direct current, an alternate current, or a combination of both, at the second tracker output 38B. The second ET tracker circuitry 42B is configured to generate a second ET modulated voltage $V_{CCB}$ at the second tracker output 38B. In this regard, the second ET tracker circuitry 42B receives a second ET modulated target voltage $V_{TARGETB}$ at a second voltage input 44B and generates the second ET modulated voltage $V_{CCB}$ tracking the second ET modulated target voltage $V_{TARGETB}$. The second ET tracker circuitry 42B is coupled to a second feedback loop 46B, which provides a sample of the second ET modulated voltage $V_{CCB}$ back to the second ET tracker circuitry 42B.

The power management circuit 30 includes switching circuitry 48, which includes switches $S_A$ and $S_B$. The switching circuitry 48 may be controlled to selectively couple the amplifier circuit 32 to the first circuit 36A or the second circuit 36B. Notably, the switches $S_A$ and $S_B$ are provided herein merely as non-limiting examples. It should be appreciated that the switching circuitry 48 may be implemented based on any type, number, and/or configuration of switches without affecting operating principles of the power management circuit 30.

When the switch $S_A$ is closed and the switch $S_B$ is open, the amplifier circuit 32 is coupled to the first tracker output 38A to receive the first ET modulated voltage $V_{CCA}$ and the first current $I_A$. The amplifier circuit 32 has a load line $R_{LOAD}$, which induces a load current $I_{LOAD}$ based on the first ET modulated voltage $V_{CCA}$ ($I_{LOAD}=V_{CCA}\div R_{LOAD}$). The amplifier circuit 32 thus amplifies the RF signal 34 to a defined power $P_{OUT}$ that is proportional to the load current $I_{LOAD}$ and the first ET modulated voltage $V_{CCA}$.

When the switch $S_B$ is closed and switch $S_A$ is open, the amplifier circuit 32 is coupled to the second tracker output 38B to receive the second ET modulated voltage $V_{CCA}$ and the second current $I_B$. Accordingly, the load line $R_{LOAD}$ induces the load current $I_{LOAD}$ based on the second ET modulated voltage $V_{CCB}$ ($I_{LOAD}=V_{CCB}\div R_{LOAD}$). The amplifier circuit 32 thus amplifies the RF signal 34 to the defined power $P_{OUT}$ that is proportional to the load current $I_{LOAD}$ and the second ET modulated voltage $V_{CCB}$.

The amplifier circuit 32 may be coupled to an antenna(s) 49 for transmitting the RF signal 34 in an RF band(s). The antenna(s) 49 may be required to transmit the RF signal 34 at a very high peak power (e.g., ≥33 dBm). To enable the amplifier circuit 32 to amplify the RF signal 34 to the very high peak power, the first ET tracker circuitry 42A or the second ET tracker circuitry 42B is required to provide a peak ET modulated voltage $V_{CCPEAK}$ at 5.5 V, which corresponds to a root-mean-square (RMS) voltage $V_{CCRMS}$ in excess of 3.4 V. Accordingly, the load current $I_{LOAD}$ induces a peak load current $I_{LOADPEAK}$ of approximately 1.5 A or a RMS load current $I_{LOADRMS}$ in excess of 1 A.

Figure 3:
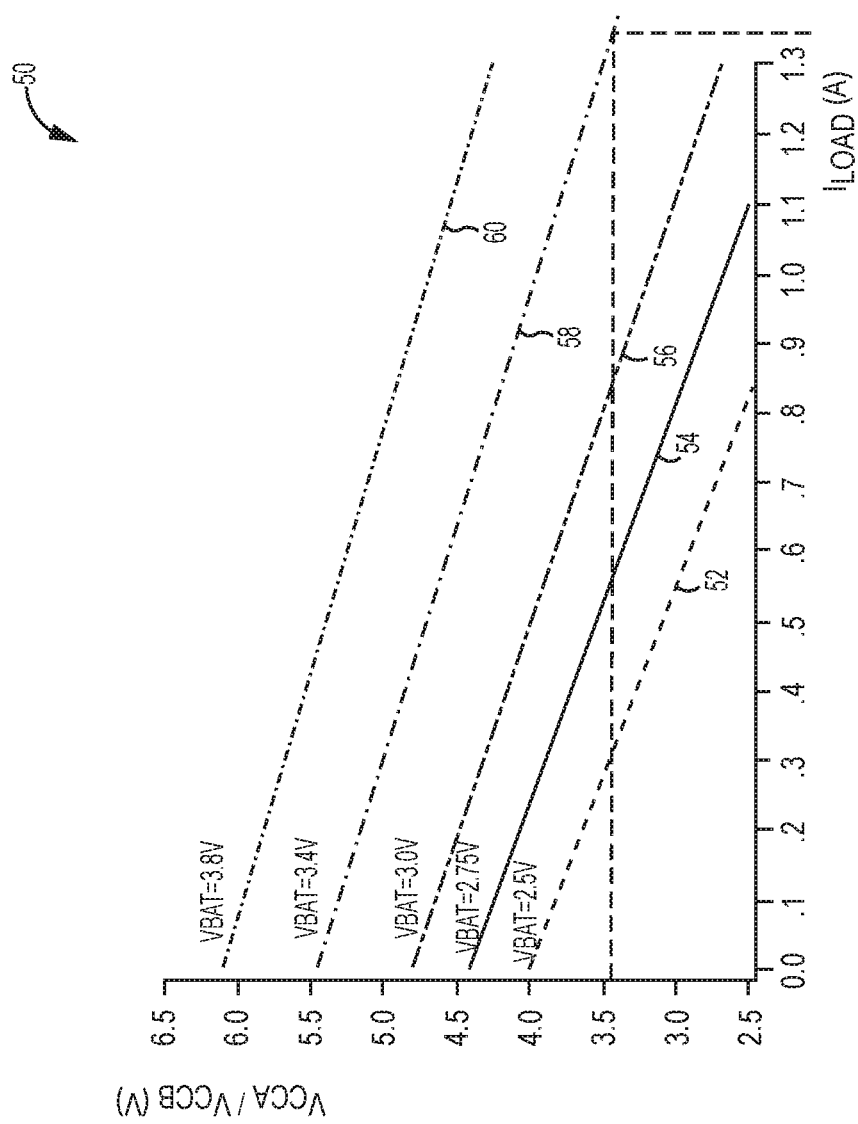
FIG. 3 is a voltage-current graph providing exemplary illustration of current and voltage boosting capability of the power management circuit of FIG. 2.

However, it may be difficult for the first circuit 36A or the second circuit 36B to concurrently maintain a higher level of ET modulated voltage and current concurrently. In this regard, FIG. 3 is a voltage-current graph 50 providing an exemplary illustration of current and voltage boosting capability of the first circuit 36A and the second circuit 36B of FIG. 2. Elements of FIG. 2 are referenced herein in conjunction with FIG. 3 and will not be re-described herein.

The voltage-current graph 50 includes a first voltage-current curve 52, a second voltage-current curve 54, a third voltage-current curve 56, a fourth voltage-current curve 58, and a fifth voltage-current curve 60. The first voltage-current curve 52 represents a voltage-vs-current relationship between the first ET modulated voltage $V_{CCA}$ or the second ET modulated voltage $V_{CCB}$ and the load current $I_{LOAD}$ when the battery voltage $V_{BAT}$ is at 2.5 V. The second voltage-current curve 54 represents a voltage-vs-current relationship between the first ET modulated voltage $V_{CCA}$ or the second ET modulated voltage $V_{CCB}$ and the load current $I_{LOAD}$ when the battery voltage $V_{BAT}$ is at 2.75 V. The third voltage-current curve 56 represents a voltage-vs-current relationship between the first ET modulated voltage $V_{CCA}$ or the second ET modulated voltage $V_{CCB}$ and the load current $I_{LOAD}$ when the battery voltage $V_{BAT}$ is at 3.0 V. The fourth voltage-current curve 58 represents a voltage-vs-current relationship between the first ET modulated voltage $V_{CCA}$ or the second ET modulated voltage $V_{CCB}$ and the load current $I_{LOAD}$ when the battery voltage $V_{BAT}$ is at 3.4 V. The fifth voltage-current curve 60 represents a voltage-vs-current relationship between the first ET modulated voltage $V_{CCA}$ or the second ET modulated voltage $V_{CCB}$ and the load current $I_{LOAD}$ when the battery voltage $V_{BAT}$ is at 3.8 V. In a non-limiting example, the first voltage-current curve 52, the second voltage-current curve 54, the third voltage-current curve 56, the fourth voltage-current curve 58, and the fifth voltage-current curve 60 can be obtained through simulations.

According to the fourth voltage-current curve 58, when the first ET modulated voltage $V_{CCA}$ or the second ET modulated voltage $V_{CCB}$ is provided at the RMS voltage $V_{CCRMS}$ of 3.4 V, the load current $I_{LOAD}$ is approximately 1.35 A. However, as illustrated by the fourth voltage-current curve 58, further increasing the load current $I_{LOAD}$ would cause the RMS voltage $V_{CCRMS}$ to drop below 3.4 V. As such, the load current $I_{LOAD}$ can be said to be inversely related to the RMS voltage $V_{CCRMS}$.

While the 1.35 A load current $I_{LOAD}$ is marginally above the 1.3 A peak load current $I_{LOADPEAK}$ required by the amplifier circuit 32 to amplify the RF signal 34 to the very high peak power (e.g., 33 dBm), there is very little margin left for a voltage standing wave ratio (VSWR) variation that can increase demand for the load current $I_{LOAD}$. Furthermore, it is necessary for the first circuit 36A or the second circuit 36B to employ relatively larger inductors to help prevent magnetic losses, direct current resistance (DCR) losses, and/or inductor saturation when inducing the 1.3 A peak load current $I_{LOADPEAK}$. Consequently, the first charge pump circuitry 40A and the second charge pump circuitry 40B need to be built with a larger footprint to accommodate the larger inductors.

Hence, it may be desirable to boost the load current $I_{LOAD}$, while maintaining the first ET modulated voltage $V_{CCA}$ or the second ET modulated voltage $V_{CCB}$, such that the amplifier circuit 32 can amplify the RF signal 34 to the desired power level (e.g., power class 2). Moreover, it may be desirable to boost the load current $I_{LOAD}$ without significantly changing the power management circuit 30 of FIG. 2.

Figure 4:
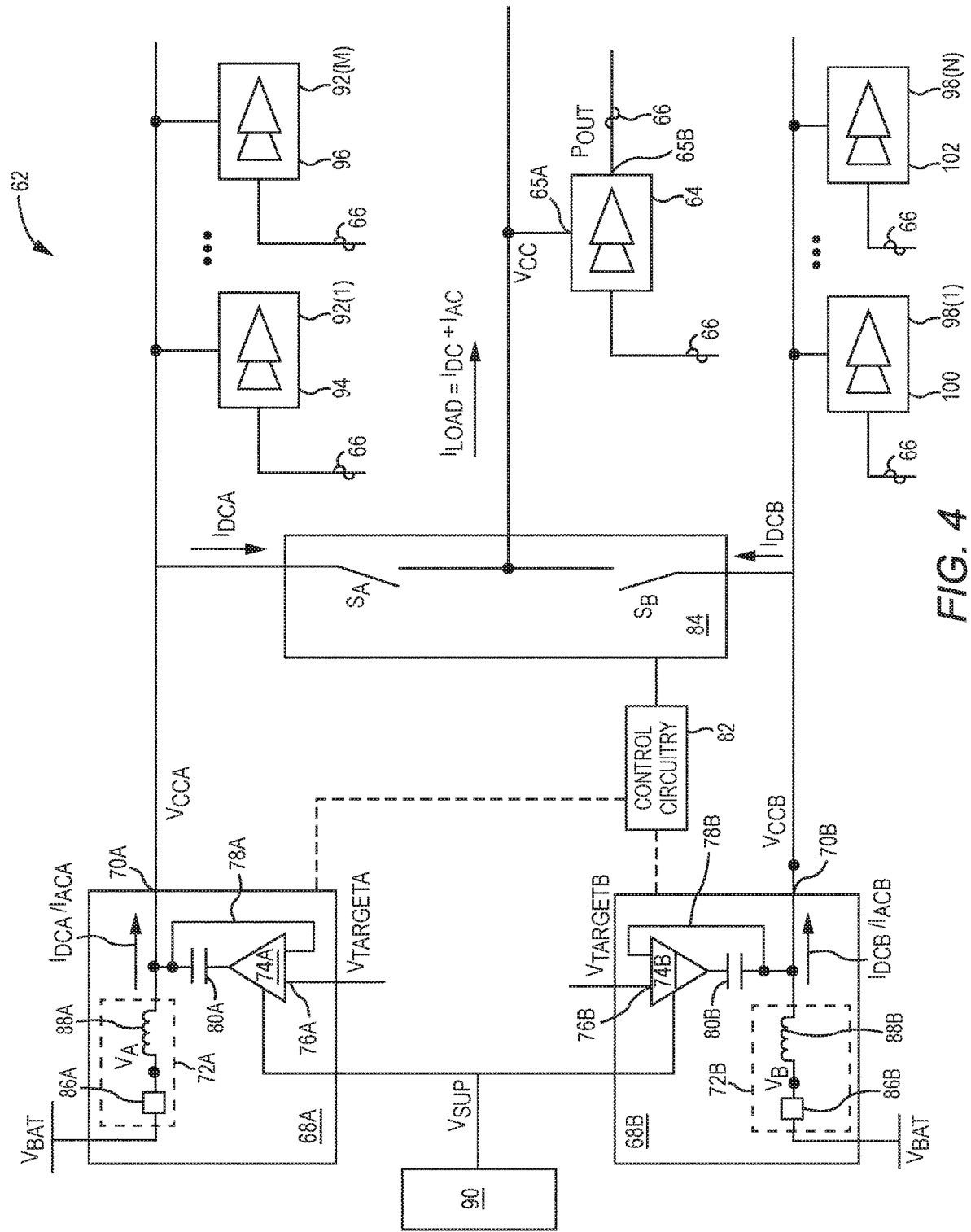
FIG. 4 is a schematic diagram of an exemplary envelope tracking (ET) power management circuit that can operate in a high-power ET mode or a normal-power ET mode according to an embodiment of the present disclosure.

In this regard, FIG. 4 is a schematic diagram of an exemplary ET power management circuit 62 that can operate in a high-power ET mode or a normal-power ET mode according to an embodiment of the present disclosure. The ET power management circuit 62 includes an amplifier circuit 64. The amplifier circuit 64 includes an amplifier input 65A and an amplifier output 65B. The amplifier circuit 64 receives a load current $I_{LOAD}$, which includes a direct current $I_{DC}$ and an alternating current $I_{AC}$, and an ET modulated voltage $V_{CC}$ at the amplifier input 65A. The amplifier circuit 64 is configured to amplify an RF signal 66 to a defined power level $P_{OUT}$ at the amplifier output 65B for transmission in at least one defined RF band. In this regard, the defined power level $P_{OUT}$ is proportionally related to the load current $I_{LOAD}$ and the ET modulated voltage $V_{CC}$ received at the amplifier input 65A. In a non-limiting example, the defined RF band can include LTE band 42 (3400-3600 MHz), LTE band 43 (3600-3800 MHz), and/or LTE band 48 (3550-3700 MHz), which are shared between 4G LTE and 5G-NR transmissions.

The ET power management circuit 62 can be dynamically configured to operate in the high-power ET mode when the defined power level $P_{OUT}$ is higher than a defined power threshold and the RF signal 66 is modulated to include less than or equal to a defined number of RBs. In a non-limiting example, the defined power threshold can be 24 dBm and the defined number of RBs can be 100 RBs.

The ET power management circuit 62 includes a first circuit 68A and a second circuit 68B. The first circuit 68A includes a first tracker output 70A coupled to the amplifier circuit 64. The first circuit 68A includes first charge pump circuitry 72A and first ET tracker circuitry 74A. The first charge pump circuitry 72A receives a battery voltage $V_{BAT}$ and generates a first direct current $I_{DCA}$ and a first alternating current $I_{ACA}$ at the first tracker output 70A. The first ET tracker circuitry 74A is configured to generate a first ET modulated voltage $V_{CCA}$ at the first tracker output 70A. In this regard, the first ET tracker circuitry 74A receives a first ET target voltage $V_{TARGETA}$ at a first voltage input 76A and generates the first ET modulated voltage $V_{CCA}$ tracking the first ET target voltage $V_{TARGETA}$. The first ET tracker circuitry 74A is coupled to a first feedback loop 78A, which provides a sample of the first ET modulated voltage $V_{CCA}$ back to the first ET tracker circuitry 74A. The first ET tracker circuitry 74A is coupled to the first tracker output 70A via a first offset capacitor 80A, which is configured to raise the first ET modulated voltage $V_{CCA}$ presented at the first tracker output 70A.

The second circuit 68B includes a second tracker output 70B coupled to the amplifier circuit 64. The second circuit 68B includes second charge pump circuitry 72B and second ET tracker circuitry 74B. The second charge pump circuitry 72B receives the battery voltage $V_{BAT}$ and generates a second direct current $I_{DCB}$ and a second alternating current $I_{ACB}$ at the second tracker output 70B. The second ET tracker circuitry 74B is configured to generate a second ET modulated voltage $V_{CCB}$ at the second tracker output 70B. In this regard, the second ET tracker circuitry 74B receives a second ET target voltage $V_{TARGETB}$ at a second voltage input 76B and generates the second ET modulated voltage $V_{CCB}$ tracking the second ET target voltage $V_{TARGETB}$. The second ET tracker circuitry 74B is coupled to a second feedback loop 78B, which provides a sample of the second ET modulated voltage $V_{CCB}$ back to the second ET tracker circuitry 74B. The second ET tracker circuitry 74B is coupled to the second tracker output 70B via a second offset capacitor 80B, which is configured to raise the second ET modulated voltage $V_{CCB}$ presented at the second tracker output 70B.

The ET power management circuit 62 includes control circuitry 82, which may be implemented by a microprocessor, a microcontroller, or a field-programmable gate array (FPGA). The control circuitry 82 is coupled to the first circuit 68A and the second circuit 68B and can dynamically control the first circuit 68A and the second circuit 68B to support the high-power ET mode and the normal-power ET mode of operations.

The ET power management circuit 62 includes switching circuitry 84, which includes switches $S_A$ and $S_B$ and is coupled to the control circuitry 82. The switching circuitry 84 is coupled to the first tracker output 70A, the second tracker output 70B, and the amplifier input 65A. In this regard, the control circuitry 82 can selectively couple the first tracker output 70A and/or the second tracker output 70B to the amplifier input 65A by opening and/or closing the switches $S_A$ and/or $S_B$. Notably, the switches $S_A$ and $S_B$ are provided herein merely as non-limiting examples. It should be appreciated that the switching circuitry 84 may be implemented based on any type, number, and/or configuration of switches without affecting operating principles of the ET power management circuit 62.

The first charge pump circuitry 72A includes a first multi-level charge pump (MCP) 86A and a first inductor(s) 88A. The first MCP 86A is configured to generate a first MCP voltage $V_A$ below the battery voltage $V_{BAT}$, equal to the battery voltage $V_{BAT}$, or two times the battery voltage $V_{BAT}$. The first inductor(s) 88A can induce the first direct current $I_{DCA}$ and the first alternating current $I_{ACA}$ based on the first MCP voltage $V_A$ at the first tracker output 70A.

The second charge pump circuitry 72B includes a second MCP 86B and a second inductor(s) 88B. The second MCP 86B is configured to generate a second MCP voltage $V_B$ below the battery voltage $V_{BAT}$, equal to the battery voltage $V_{BAT}$, or two times the battery voltage $V_{BAT}$. The second inductor(s) 88B can induce the second direct current $I_{DCB}$ and the second alternating current $I_{ACB}$ based on the second MCP voltage $V_B$ at the second tracker output 70B.

In the high-power ET mode, the control circuitry 82 controls the first charge pump circuitry 72A and the second charge pump circuitry 72B to provide the first direct current $I_{DC}$ and the second direct current $I_{DCB}$, respectively, to the amplifier circuit 64. More specifically, the control circuitry 82 may close the switches $S_A$ and $S_B$ such that the first direct current $I_{DCA}$ and the second direct current $I_{DCB}$ can be provided to the amplifier circuit 64. In a non-limiting example, the first direct current $I_{DCA}$ substantially equals the second direct current $I_{DCB}$ (e.g., $I_{DCA}=I_{DCB}\pm 0.1$ mA). In this regard, the first direct current $I_{DCA}$ and the second direct current $I_{DCB}$ each equal approximately one-half (½) of the direct current $I_{DC}$ ($I_{DCA}=I_{DCB}=½ I_{DC}$). It should be appreciated that it is also possible to configure the first charge pump circuitry 72A and the second charge pump circuitry 72B to generate the first direct current $I_{DCA}$ differently from the second direct current $I_{DCB}$, as long as a sum of the first direct current $I_{DCA}$ and the second direct current $I_{DCB}$ equals the direct current $I_{DC}$.

Recalling previous discussions in FIG. 2, the first charge pump circuitry 40A or the second charge pump circuitry 40B is required to supply the entire load current $I_{LOAD}$ in the power management circuit 30. In this regard, by activating both the first charge pump circuitry 72A and the second charge pump circuitry 72B to each provide ½ of the direct current $I_{DC}$, the first inductor(s) 88A and the second inductor(s) 88B can be smaller inductors (e.g., inductor with 2.2 µH inductance). As a result, it is possible to reduce footprint and cost of the ET power management circuit 62.

Since each of the first charge pump circuitry 72A and the second charge pump circuitry 72B supplies ½ of the direct current $I_{DC}$, respective equivalent series resistance (ESR) associated with the first charge pump circuitry 72A and the second charge pump circuitry 72B is also reduced, thus helping to improve ET efficiency of the ET power management circuit 62. In addition, splitting the direct current among the first charge pump circuitry 72A and the second charge pump circuitry 72B can lead to improved power dissipation in the first charge pump circuitry 72A and the second charge pump circuitry 72B. Further, it helps to improve VSWR for the ET power management circuit 62.

The control circuitry 82 also activates a selected ET tracker circuitry among the first ET tracker circuitry 74A and the second ET tracker circuitry 74B in a selected circuit among the first circuit 68A and the second circuit 68B to provide a selected ET modulated voltage among the first ET modulated voltage $V_{CCA}$ and the second ET modulated voltage $V_{CCB}$ to the amplifier circuit 64. Further, the control circuitry 82 controls a selected charge pump in the selected circuit to provide a selected alternating current among the first alternating current $I_{ACA}$ and the second alternating current $I_{ACB}$ to the amplifier input 65A as the alternating current $I_{AC}$. As such, the load current $I_{LOAD}$ at the amplifier input 65A can be expressed in equation (Eq. 1) below.

$$I_{LOAD}=I_{DC}+I_{AC}=(I_{DCA}+I_{DCB})+(I_{ACA} \text{ or } I_{ACB}) \qquad (Eq. 1)$$

In one non-limiting example, in the high-power ET mode, the control circuitry 82 activates the first charge pump circuitry 72A and the second charge pump circuitry 72B to provide the first direct current $I_{DCA}$ and the second direct current $I_{DCB}$ at the first tracker output 70A and the second tracker output 70B, respectively. The control circuitry 82 also controls the switching circuitry 84 to provide the first direct current $I_{DCA}$ and the second direct current $I_{DCB}$ to the amplifier input 65A. Further, the control circuitry 82 configures the first charge pump circuitry 72A to generate the first alternating current $I_{ACA}$ at the first tracker output 70A and controls the switching circuitry 84 to provide the first alternating current $I_{ACA}$ to the amplifier input 65A as the alternating current $I_{AC}$. The control circuitry 82 further configures the second charge pump circuitry 72B not to generate the second alternating current $I_{ACB}$ at the second tracker output 70B.

The control circuitry 82 also activates the first ET tracker circuitry 74A to generate the first ET modulated voltage $V_{CCA}$ at the first tracker output 70A and controls the switching circuitry 84 to provide the first ET modulated voltage $V_{CCA}$ to the amplifier input 65A as the ET modulated voltage $V_{CC}$. The second ET tracker circuitry 74B, on the other hand, is not needed. Accordingly, the control circuitry 82 deactivates the second ET tracker circuitry 74B to help reduce power consumption of the ET power management circuit 62.

In another non-limiting example, in the high-power ET mode, the control circuitry 82 activates the first charge pump circuitry 72A and the second charge pump circuitry 72B to provide the first direct current $I_{DCA}$ and the second direct current $I_{DCB}$ at the first tracker output 70A and the second tracker output 70B, respectively. The control circuitry 82 also controls the switching circuitry 84 to provide the first direct current $I_{DCA}$ and the second direct current $I_{DCB}$ to the amplifier input 65A. Further, the control circuitry 82 configures the second charge pump circuitry 72B to generate the second alternating current $I_{ACB}$ at the second tracker output 70B and controls the switching circuitry 84 to provide the second alternating current $I_{ACB}$ to the amplifier input 65A as the alternating current $I_{AC}$. The control circuitry 82 further configures the first charge pump circuitry 72A not to generate the first alternating current $I_{ACA}$ at the first tracker output 70A.

The control circuitry 82 also activates the second ET tracker circuitry 74B to generate the second ET modulated voltage $V_{CCB}$ at the second tracker output 70B and controls the switching circuitry 84 to provide the second ET modulated voltage $V_{CCB}$ to the amplifier input 65A as the ET modulated voltage $V_{CC}$. The first ET tracker circuitry 74A, on the other hand, is not needed. Accordingly, the control circuitry 82 deactivates the first ET tracker circuitry 74A to help reduce power consumption of the ET power management circuit 62.

The ET power management circuit 62 can be dynamically configured to operate in the normal-power ET mode when the defined power level $P_{OUT}$ is less than or equal to a defined power threshold and the RF signal 66 is modulated to include more than the defined number of RBs. In this regard, the control circuitry 82 activates a selected charge pump circuitry among the first charge pump circuitry 72A and the second charge pump circuitry 72B in a selected circuit among the first circuit 68A and the second circuit 68B to generate a selected direct current among the first direct current $I_{DCA}$ and the second direct current $I_{DCB}$ at a selected tracker output among the first tracker output 70A and the second tracker output 70B. The control circuitry 82 also configures the selected charge pump circuitry to generate a selected alternating current among the first alternating current $I_{ACA}$ and the second alternating current $I_{ACB}$ at the selected tracker output. The control circuitry 82 further configures a selected ET tracker circuitry in the selected circuit to generate a selected ET modulated voltage among the first ET modulated voltage $V_{CCA}$ and the second ET modulated voltage $V_{CCB}$ at the selected tracker output. Accordingly, the control circuitry 82 controls the switching circuitry 84 to couple the selected tracker output to the amplifier input 65A.

In one non-limiting example, in the normal-power ET mode, the control circuitry 82 activates the first charge pump circuitry 72A to generate the first direct current $I_{DCA}$ and the first alternating current $I_{ACA}$ at the first tracker output 70A. The control circuitry 82 further activates the first ET tracker circuitry 74A to generate the first ET modulated voltage $V_{CCA}$ at the first tracker output 70A. Accordingly, the control circuitry 82 controls the switching circuitry 84 (e.g., closing $S_A$ and opening $S_B$) to couple the first tracker output 70A to the amplifier input 65A.

Concurrent to activating the first charge pump circuitry 72A and the first ET tracker circuitry 74A, the control circuitry 82 may deactivate the second charge pump circuitry 72B and the second ET tracker circuitry 74B. Alternatively, the control circuitry 82 may configure the second charge pump circuitry 72B and the second ET tracker circuitry 74B to provide the second direct current $I_{DCB}$, the second alternating current $I_{ACB}$, and/or the second ET modulated voltage $V_{CCB}$ to other amplifier circuits in the ET power management circuit 62.

In another non-limiting example, in the normal-power ET mode, the control circuitry 82 activates the second charge pump circuitry 72B to generate the second direct current $I_{DCB}$ and the second alternating current $I_{ACB}$ at the second tracker output 70B. The control circuitry 82 also activates the second ET tracker circuitry 74B to generate the second ET modulated voltage $V_{CCB}$ at the second tracker output 70B. Accordingly, the control circuitry 82 controls the switching circuitry 84 (e.g., closing $S_B$ and opening $S_A$) to couple the second tracker output 70B to the amplifier input 65A.

Concurrent to activating the second charge pump circuitry 72B and the second ET tracker circuitry 74B, the control circuitry 82 may deactivate the first charge pump circuitry 72A and the first ET tracker circuitry 74A. Alternatively, the control circuitry 82 may configure the first charge pump circuitry 72A and the first ET tracker circuitry 74A to provide the first direct current $I_{DCA}$, the first alternating current $I_{ACA}$, and/or the first ET modulated voltage $V_{CCA}$ to other amplifier circuits in the ET power management circuit 62.

The first ET tracker circuitry 74A and the second ET tracker circuitry 74B may be configured to generate the first ET modulated voltage $V_{CCA}$ and the second ET modulated voltage $V_{CCB}$ based on a common supply voltage $V_{SUP}$. In a non-limiting example, the ET power management circuit 62 includes inductor-based buck-boost circuitry 90. The inductor-based buck-boost circuitry 90 is coupled to the first ET tracker circuitry 74A and the second ET tracker circuitry 74B. The inductor-based buck-boost circuitry 90 is configured to generate the common supply voltage $V_{SUP}$ and provide the common supply voltage $V_{SUP}$ to the first ET tracker circuitry 74A and the second ET tracker circuitry 74B. By employing the inductor-based buck-boost circuitry 90, as opposed to capacitor-based buck-boost circuitry, it may be possible to generate the common supply voltage $V_{SUP}$ based on a reduced battery voltage.

The ET power management circuit 62 may include one or more first amplifier circuits 92(1)-92(M). The first amplifier circuits 92(1)-92(M) are coupled to the first tracker output 70A. In a non-limiting example, the first amplifier circuits 92(1)-92(M) include an LTE mid-low-band (MLB) amplifier circuit 94 and an LTE low-band (LB) amplifier circuit 96. The LTE MLB amplifier circuit 94 is configured to amplify the RF signal 66 for transmission in LTE MLB between 1700-1900 MHz. The LTE LB amplifier circuit 96 is configured to amplify the RF signal 66 for transmission in LTE LB between 450-960 MHz.

In a non-limiting example, in the normal-power ET mode, when the control circuitry 82 activates the second charge pump circuitry 72B and the second ET tracker circuitry 74B and controls the switching circuitry 84 to couple the second tracker output 70B to the amplifier input 65A, it may be possible to configure the first charge pump circuitry 72A and the first ET tracker circuitry 74A to provide the first direct current $I_{DCA}$, the first alternating current $I_{ACA}$, and the first ET modulated voltage $V_{CCA}$ to the LTE MLB amplifier circuit 94 and/or the LTE LB amplifier circuit 96, thus allowing the ET power management circuit 62 to support uplink carrier aggregation (ULCA).

The ET power management circuit 62 includes one or more second amplifier circuits 98(1)-98(N). The second amplifier circuits 98(1)-98(N) are coupled to the second tracker output 70B. In a non-limiting example, the second amplifier circuits 98(1)-98(N) include an LTE high-band (HB) amplifier circuit 100 and an LTE mid-band (MB) amplifier circuit 102. The LTE HB amplifier circuit 100 is configured to amplify the RF signal 66 for transmission in LTE HB between 2300-2700 MHz. The LTE MB amplifier circuit 102 is configured to amplify the RF signal 66 for transmission in LTE MB between 1950-2200 MHz.

In another non-limiting example, in the normal-power ET mode, when the control circuitry 82 activates the first charge pump circuitry 72A and the first ET tracker circuitry 74A and controls the switching circuitry 84 to couple the first tracker output 70A to the amplifier input 65A, it may be possible to configure the second charge pump circuitry 72B and the second ET tracker circuitry 74B to provide the second direct current $I_{DCB}$, the second alternating current $I_{ACB}$, and the second ET modulated voltage $V_{CCB}$ to the LTE HB amplifier circuit 100 and/or the LTE MB amplifier circuit 102, thus allowing the ET power management circuit 62 to support ULCA.

Those skilled in the art will recognize improvements and modifications to the preferred embodiments of the present disclosure. All such improvements and modifications are considered within the scope of the concepts disclosed herein and the claims that follow.

What is claimed is:
1. An envelope tracking (ET) power management circuit, comprising:
   an amplifier circuit comprising an amplifier input and an amplifier output and configured to output a radio frequency (RF) signal at the amplifier output at a defined power level corresponding to a direct current, an alternating current, and an ET modulated voltage received at the amplifier input;
a first circuit coupled to the amplifier input and configured to generate a first ET modulated voltage, a first direct current, and a first alternating current;
a second circuit coupled to the amplifier input and configured to generate a second ET modulated voltage, a second direct current, and a second alternating current; and
control circuitry coupled to the first circuit and the second circuit, the control circuitry configured to configure the first circuit and the second circuit to operate in a high-power ET mode in response to the defined power level exceeding a defined power threshold and the RF signal comprising less than or equal to a defined number of resource blocks (RBs).

2. The ET power management circuit of claim 1 wherein the first direct current substantially equals the second direct current.

3. The ET power management circuit of claim 1 wherein the defined power threshold equals 24 dBm and the defined number of RBs equals 100 RBs.

4. The ET power management circuit of claim 1 further comprising switching circuitry configured to couple the first circuit and the second circuit to the amplifier input, wherein:
the first circuit comprises:
first ET tracker circuitry configured to generate the first ET modulated voltage; and
first charge pump circuitry configured to generate the first direct current and the first alternating current;
the second circuit comprises:
second ET tracker circuitry configured to generate the second ET modulated voltage; and
second charge pump circuitry configured to generate the second direct current and the second alternating current; and
the control circuitry is further configured to activate the first charge pump circuitry and the second charge pump circuitry to provide the first direct current and the second direct current to the amplifier input.

5. The ET power management circuit of claim 4 wherein, in the high-power ET mode, the control circuitry is further configured to:
control the switching circuitry to couple the first charge pump circuitry and the second charge pump circuitry to the amplifier input to provide the first direct current and the second direct current to the amplifier input; and activate a selected ET tracker circuitry among the first ET tracker circuitry and the second ET tracker circuitry in a selected circuit among the first circuit and the second circuit to provide a selected ET modulated voltage among the first ET modulated voltage and the second ET modulated voltage to the amplifier input.

6. The ET power management circuit of claim 5 wherein, in the high-power ET mode, the control circuitry is further configured to:
control the switching circuitry to couple the selected ET tracker circuitry to the amplifier input to provide the selected ET modulated voltage to the amplifier input;
control a selected charge pump circuitry in the selected circuit to provide a selected alternating current among the first alternating current and the second alternating current to the amplifier input; and
control the switching circuitry to couple the selected charge pump circuitry to the amplifier input to provide the selected alternating current to the amplifier input.

7. The ET power management circuit of claim 4 wherein the control circuitry is further configured to:
configure the first circuit and the second circuit to operate in a normal-power ET mode in response to the defined power level being less than or equal to the defined power threshold and the RF signal comprising more than the defined number of RBs;
activate selected charge pump circuitry among the first charge pump circuitry and the second charge pump circuitry in a selected circuit among the first circuit and the second circuit to provide a selected direct current among the first direct current and the second direct current and a selected alternating current among the first alternating current and the second alternating current to the amplifier input; and
activate selected ET tracker circuitry in the selected circuit to provide a selected ET modulated voltage among the first ET modulated voltage and the second ET modulated voltage to the amplifier input.

8. The ET power management circuit of claim 4 further comprising inductor-based buck-boost circuitry configured to generate a common supply voltage based on a battery voltage, wherein the first ET tracker circuitry and the second ET tracker circuitry are further configured to generate the first ET modulated voltage and the second ET modulated voltage, respectively, based on the common supply voltage.

* * * * *